(12) United States Patent
Nagao

(10) Patent No.: US 6,946,674 B2
(45) Date of Patent: Sep. 20, 2005

(54) LOW-DIMENSIONAL PLASMON LIGHT EMITTING DEVICE

(75) Inventor: Tadaaki Nagao, Tagajo (JP)

(73) Assignee: Japan Science and Technology Corporation (JP)

( * ) Notice: Subject to any disclaimer, the term of this patent is extended or adjusted under 35 U.S.C. 154(b) by 0 days.

(21) Appl. No.: 10/471,362

(22) PCT Filed: Mar. 11, 2002

(86) PCT No.: PCT/JP02/02242

§ 371 (c)(1),
(2), (4) Date: Sep. 11, 2003

(87) PCT Pub. No.: WO02/073707

PCT Pub. Date: Sep. 19, 2002

(65) Prior Publication Data

US 2004/0079938 A1 Apr. 29, 2004

(30) Foreign Application Priority Data

Mar. 12, 2001 (JP) .................................... 2001-069387

(51) Int. Cl.$^7$ .............................................. H01L 33/00
(52) U.S. Cl. .............................. 257/13; 257/94; 257/98; 372/45
(58) Field of Search .............................. 257/13, 94, 98; 372/45

(56) References Cited

U.S. PATENT DOCUMENTS

| | | | | |
|---|---|---|---|---|
| 4,706,251 A | * | 11/1987 | Rona .............................. | 372/4 |
| 4,874,953 A | * | 10/1989 | Katz ........................ | 250/493.1 |
| 6,501,783 B1 | * | 12/2002 | Capasso et al. ............... | 372/96 |
| 6,534,798 B1 | * | 3/2003 | Scherer et al. ................ | 257/98 |

FOREIGN PATENT DOCUMENTS

| | | |
|---|---|---|
| EP | 0 977 329 A2 | 2/2000 |
| GB | 2311413 A | 9/1997 |
| JP | 61-239679 | 10/1986 |
| JP | 01-179490 A | 7/1989 |
| JP | 8-503817 A | 4/1996 |

OTHER PUBLICATIONS

P.D. Sparks, et al., Light Emission From the Slow Mode of Tunnel Junctions on Short Period Diffraction Gratings, Physical Review Letters, vol. 68, No. 17, pp. 2668–2671, (1992).

Sukekatsu Ushioda, et al., Grating–Coupled Light Emission From the Slow Mode of Metal–Insulator–Metal Tunnel Junctions, Japanese Journal of Applied Physics, Part 2, vol. 31, No. 7A, vol. 31, pp. L870–L873, (1992).

Frank Stern, Polarization of a Two–Dimensional Electron Gas, Physical Review Letters, vol. 18, No. 14, pp. 546–548 (1967).

Sama et al., Dynamical Response of a One–Dimensional Quantum–Wire Electron System, Physical Review B, vol. 54, No. 3, pp. 1936–1946 (1996).

M. Rocca, Low–Energy EELS Investigation of Surface Electronic Excitations on Metals, Surface Science Reports 22, pp. 1–71, (1995).

* cited by examiner

*Primary Examiner*—Jerome Jackson
(74) *Attorney, Agent, or Firm*—The Webb Law Firm

(57) ABSTRACT

A low-dimensional plasmon-light emitter for converting an inputted electric energy luminescence with an arbitrary energy over a broad range. The emitter has a low-dimensional conductive structure incorporated inside or in a surface layer of a semiconductor or dielectric. A periodic nanostructure is incorporated in the vicinity of or inside the low-dimensional conductive structure. The low-dimensional conductive structure may be a quantum well formed inside a semiconductor or dielectric, a space-charge layer formed on a surface or heterojunction of a semiconductor or dielectric, or a surface or interface electronic band with high carrier density formed on a surface or heterojunction of a semiconductor or dielectric. The periodic nanostructure is selected from a periodic structure formed by vapor-deposition or etching of fine metallic wires, a periodic structure of a film formed on surfaces with atomic steps, or a periodic structure self-organized during epitaxial growth or polymerization of an organic molecule or polymer.

5 Claims, 3 Drawing Sheets

LOW-DIMENSIONAL PLASMON LIGHT EMITTING DEVICE

This application is a 371 of PCT/JP02/02242, Mar. 11, 2002.

BACKGROUND OF THE INVENTION

1. Field of the Invention

The present invention relates to a low-dimensional plasmon-light emitter, which can produce low-dimensional plasmon-light with an arbitrary energy over a broad range from a far-infrared region to an ultraviolet region.

2. Description of Related Art

When carriers are recombined at p·n junctions of a semiconductor or relaxed from an excited state to a ground state, luminescence is emitted. The luminescence is used in various fields, e.g. sensors, light emitters and display devices. Since an energy level of a substance is substantially determined in correspondence with its composition and structure, a luminescent energy is nearly constant in relation with the type of substance. According to prior art references, luminescent energy is varied by selection of a substance or combination of substances. That is, production of luminescence with an arbitrary energy is theoretically impossible, unless the type of substance or combination of substances is changed.

Furthermore, surface-plasmon is excited by resonating a charge density wave, which exists on a metallic surface, with light. Surface-plasmon has been applied to various sensors for detecting or measuring refractive index or absorptance of liquids, mono-molecular films, solid surfaces and so on. Application of the surface-plasmon luminescence to laser diodes is disclosed in WO 94/13044A.

Surface-plasmon luminescence is limited to light emission with an energy near a frequency of the surface-plasmon (calculated as a square root of a bulk-plasma frequency). Change of a luminescent energy necessitates selection and ultra-micronization of a material. However, the luminescent energy is mostly limited to an ultraviolet region with poor mono-chromaticity, even when the material is properly selected or prepared as fine particles.

On the other hand, low-dimensional plasmon originating in a fluctuation of a charge of density wave has the feature that its energy can be varied over a broad range in correspondence with its frequency. Such low-dimensional plasmon localizes in a two-dimensional or a one-dimensional structure. In this sense, production of luminescence with an arbitrary energy over a broad range from a far-infrared region to an ultraviolet region is estimated by changing a nanostructure in the same material without the necessity of a selection or combination of substances corresponding to an objective luminescent energy.

BRIEF SUMMARY OF THE INVENTION

The present invention is directed to a light emitter, which can produce low-dimensional plasmon-light over a broad range from a far-infrared region to an ultraviolet region. An object of the present invention is to incorporate a periodic nanostructure in a low-dimensional conductive structure, which is suitable for generation of low-dimensional plasmon with controlled thickness and width.

The present invention proposes a low-dimensional plasmon-light emitter, which has a low-dimensional conductive structure for generation of low-dimensional plasmon inside or in a surface layer of a semiconductor or dielectric. A periodic nanostructure, which has a periodicity corresponding to a real space periodicity $D_1(=2\pi/q_1)$, wherein a wavenumber $q_1$ gives a specified luminescent energy $(h/2\pi)\omega_1$ in a wavenumber-energy curve of low-dimensional plasmon, is incorporated in the vicinity of or inside the low-dimensional conductive structure. In the formula of $(h/2\pi)\omega_1$, h is Planck's constant in quantum mechanics and defined by the formula of:

$$\hbar = h/2\pi$$

The low-dimensional conductive structure may be a quantum well formed inside a semiconductor or dielectric, a space-charge layer formed in the vicinity of a surface or heterojunction of a semiconductor or dielectric, a surface or interfacial electronic band with high carrier density formed in the vicinity of a surface or heterojunction of a semiconductor or dielectric, an epitaxial layer of a metal film, a conductive molecule or a polymer and a low-dimensional conductive structure present in an oxide superconductor or other inorganic substance. The periodic nanostructure may be nano-fabricated fine metallic wires, a periodic structure such as etch pits, a periodic structure of a film formed on surfaces with atomic steps or a periodic structure which is self-organized during epitaxial growth or polymerization of an organic molecule or polymer.

DETAILED DESCRIPTION OF THE INVENTION

Volume plasmon in a three-dimensional solid matter and surface-plasmon or Mie plasmon in the vicinity of a three-dimensional solid matter are examples of three-dimensional plasmon. On the other hand, low-dimensional plasmon is originated in fluctuation of a charge density wave, which localizes in a two-dimensional plane or a one-dimensional structure.

Dispersion of a plasmon frequency $\omega_p(q)$ with respect to a wavenumber q of three-dimensional plasmon is represented by the below-mentioned formula, wherein $\omega_{p0}$ is a plasma frequency determined by carrier density N and effective mass m* of a solid matter, and α and β are constants, as disclosed in H. Raether, Excitation of plasmons and Interband Transitions by Electrons, Vol.88 of Springer Tracts in Modern Physics (Springer, Berlin, 1980) and Surface Science Reports 22 (1995) pp.1–71.

$$\omega_{p0} = \left(\frac{4\pi ne^2}{m^*}\right)^{1/2} \quad (CGS) \text{ or } \left(\frac{2\pi ne^2}{m^*}\right)^{1/2}$$

a frequency of bulk-plasmon a frequency of surface-plasmon $$\omega_p(q) = \omega_{p0} + \alpha q + \beta q^2 + O(q^3)$$

Figure 1:
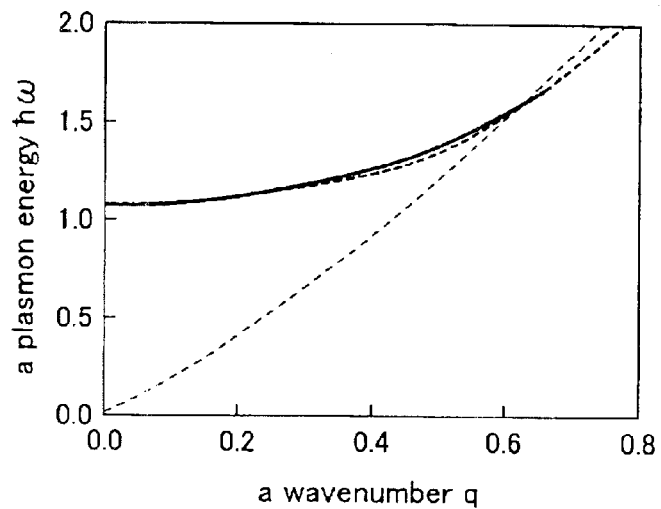
FIG. 1 is a graph showing a wavenumber-energy curve of three-dimensional plasmon.
Figure 2:
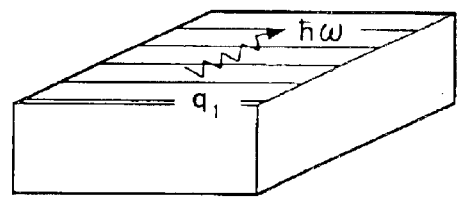
FIG. 2 is a schematic view illustrating distribution of charge density of low-dimensional plasmon.

The vibration energy $\omega_p$ is finite at q=0 and substantially deviates to a positive side with an increase of the wavenumber q. As a result, the vibration frequency $\omega_p(q)$ is limited to the plasma frequency $\omega_{p0}$ at most. Plasmon is not generated due to Landau damping at a wavenumber q more than Fermi wavenumber $q_F$ of a substance. In short, three-dimensional plasmon has an energy close to the value of $\omega_{p0}$, as shown in FIG. 1.

On the other hand, low-dimensional plasmon that originated in a charge density wave localized in a one-dimensional structure or two-dimensional plasmon that originated in a charge density wave localized in a two-dimensional plane has a vibration energy distribution quite different from the three-dimensional plasmon. For instance, energy dispersion of two-dimensional plasmon between two dielectrics with dielectric functions $\in_1$, $\in_2$ approximated by the following formula, wherein $N_{2D}$ is two-dimensional carrier density, m* is effective carrier mass and $_{//}$ is a component of a wavenumber in parallel to a two-dimensional surface structure, as disclosed in Phys. Rev. Lett. 18, pp. 546–548 (1967).

$$\omega_{2D}(q_{//})^2 \cong \frac{4\pi N_{2D}}{(\varepsilon_1 + \varepsilon_2)m^*} \cdot q_{//} + \frac{3\hbar^2 \pi N_{2D}}{2m^{*2}} \cdot q_{//}^2 + O(q_{//}^3)$$

Figure 3:
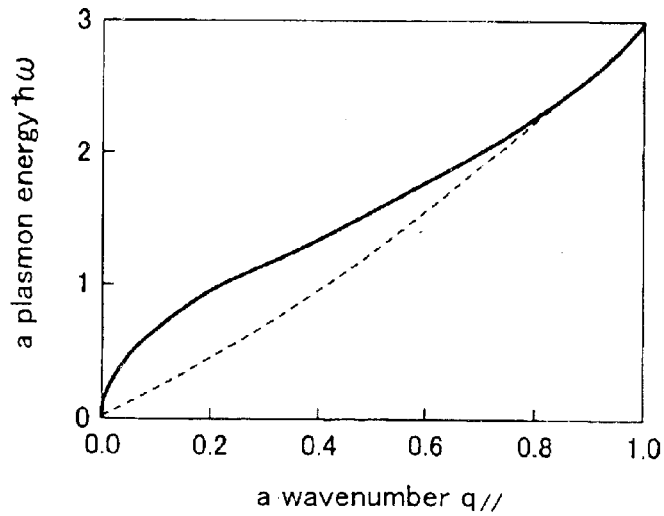
FIG. 3 is a graph showing a wavenumber-energy curve of low-dimensional plasmon.

The specified energy dispersion means that a plasmon energy can be generated over a broad range from a far-infrared region to an ultraviolet region by proper selection of a substance, which has two-dimensional carrier density $N_{2D}$, effective carrier mass m* and permittivities $\in_1$, $\in_2$ each suitable for the purpose, as shown in FIG. 3.

One-dimensional plasmon has energy dispersion approximated by the following formula, wherein $N_{1D}$ is one-dimensional carrier density and a is a constant, as disclosed in Phys. Rev. B, pp. 1936–1946 (1996). Therefore, a plasmon energy is generated over a broad range from a far-infrared region to an ultraviolet region by proper selection of a substance.

$$\omega_{1D}(q_{//})^2 = \alpha N_{1D} q z, 900 \cdot \sqrt{|\ln|q_{//}||}$$

The energy of the low-dimensional plasmon is varied from zero to a large extent as a function of plasmon momentum, as mentioned above. However, a dispersion relation of the low-dimensional plasmon does not cross a dispersion relation of an electromagnetic wave except for zero energy. Therefore, the plasmon energy can not be converted to a luminescent energy under normal conditions.

In this regard, a periodic nanostructure is incorporated inside or in the vicinity of a low-dimensional conductive structure, in order to enhance combination of plasmon with light, resulting in production of plasmon luminescence. The periodic nanostructure in this specification means a structure, which has a periodicity corresponding to a real space periodicity $D_1(=2\pi/q_1)$, wherein a wavenumber $q_1$ gives a specified luminescent energy $(h/2\pi)\omega_1$ in a wavenumber-energy curve of low-dimensional plasmon.

Figure 4:
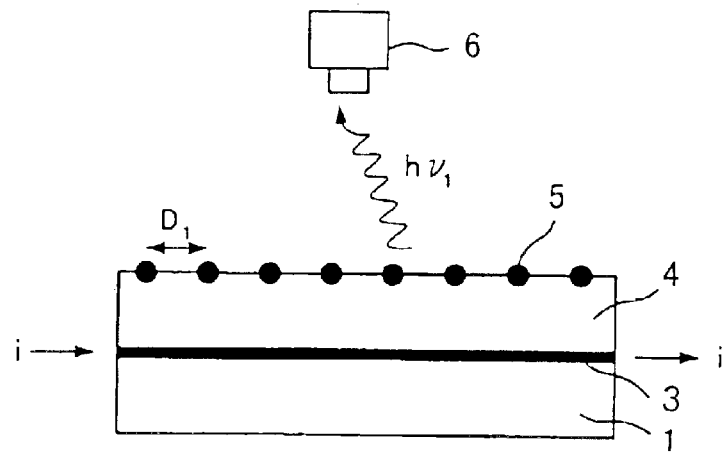
FIG. 4 is a light emitter, which has a periodic nanostructure formed in a surface layer of a dielectric.
Figure 5:
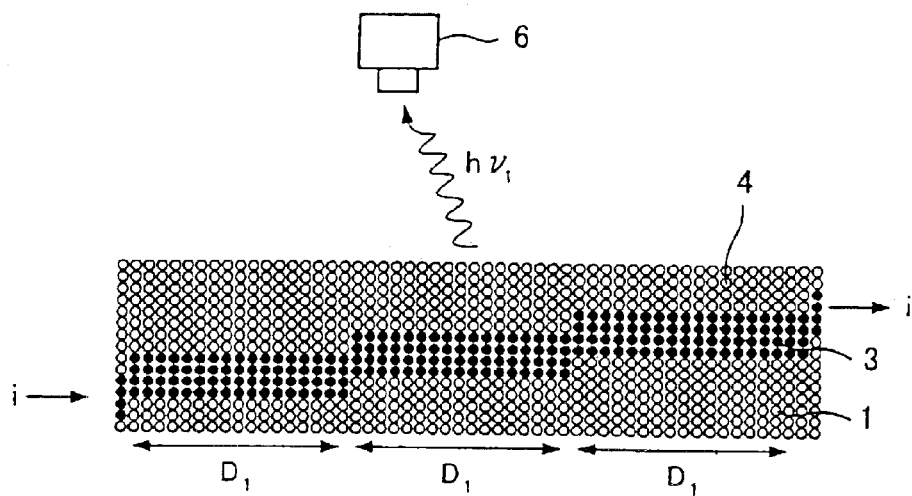
FIG. 5 is a schematic view illustrating another light emitter, which has a low-dimensional conductive structure with a periodic nanostructure formed on surfaces with atomic steps.
Figure 6:
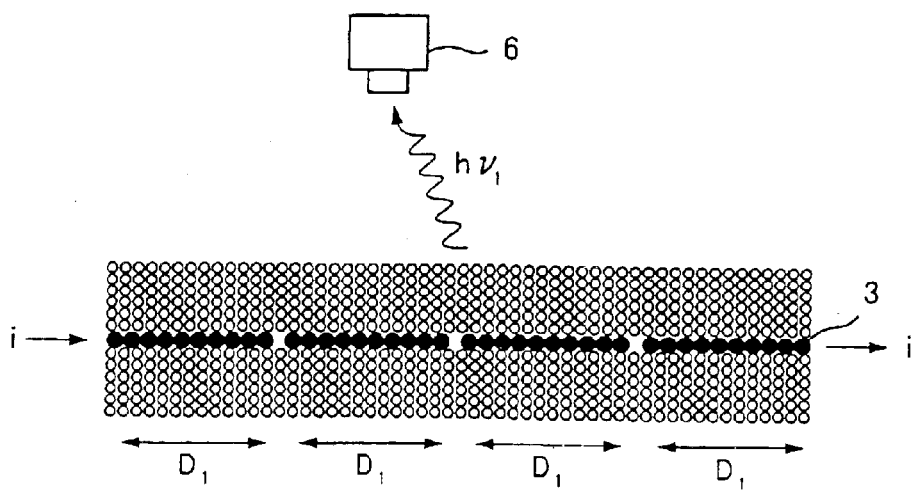
FIG. 6 is a schematic view illustrating another light emitter, which has a low-dimensional conductive structure with a periodic nanostructure formed by epitaxial growth of a conductive molecule or polymer.

A periodic structure 5 (FIG. 4), which is incorporated in a surface layer of or inside dielectrics 1 and 4 by nano-fabricating, or periodic structures (FIGS. 5 and 6), which are incorporated in a low-dimensional conductive structure 3 at an interface between dielectrics 1 and 4, are suitable for the purpose. The periodic nanostructure 5 or the low-dimensional conductive structure 3 with the periodic nanostructure has a pattern unit repeated with a predetermined pitch $D_1$. Plasmon momentum $q_1$ capable of coupling with an electromagnetic wave is controlled by the periodic pattern with the pitch $D_1$. Consequently, luminescence with a predetermined energy $(h/2\pi)\omega_1$ or $hv_1$ is produced by selectively coupling plasmon, which has an energy $(h/2\pi)\omega_1$ corresponding to predetermined plasmon momentum, with light.

An energy is inputted to low-dimensional plasmon by charging carriers of a low-dimensional structure with a direct or alternative electric field, i.e. input of a direct or alternative current i, and the electric energy is converted to luminescence with a predetermined energy $(h/2\pi)\omega_1$. The line width of the emission spectrum can be narrowed by improving accuracy of the pitch $D_1$, thus reducing defect density in a crystal and soon.

Low-dimensional conductive structures are representatively listed below:

(a) A space-charge layer or a quantum well, which is formed on a surface or interface of a semiconductor or dielectric for storage of carriers.

(b) A surface or interfacial electronic band with high carrier density, which is formed on a surface or heterojunction of a semiconductor or dielectric.

(c) A δ-doped layer with high carrier density, which is formed inside a semiconductor or dielectric.

(d) A one-dimensional structure, which has a confinement structure nano-fabricated in a two-dimensional structure such as a space-charge layer or a quantum well along a planar direction.

(e) A low-dimensional conductive structure with high density, which is formed in a conductive organic molecule, a conductive polymer, an oxide superconductor and other organic substances with one- or two-dimensional structures.

The low-dimensional conductive structures (b), (c) and (e) allow presence of plasmon with thickness similar to a monolayer, so that a periodic nanostructure is incorporated in a atomic sized structural body. As a result, a solid light-emitting element, which produces luminescence over a broad range from a far-infrared region to an ultraviolet region, can be fabricated in a size from sub-nanometer to several hundreds of nanometer scale.

The following structures (A) to (C) may be used for coupling low-dimensional plasmon, which consists in the low-dimensional conductive structure, with light.

(A) A periodic structure 5 (FIG. 4), which is constructed from fine metallic wires, grooves or dots formed on a dielectric layer 4 in the vicinity of a low-dimensional conductive structure by nano-fabricating, e.g. masked deposition, focused ion-beam processing or electron-beam lithography.

(B) A low-dimensional conductive structure, which has a periodic nanostructure incorporated therein by selection of a template substrate suitable for growth of a film and self-organization of the film during growth. A low-dimensional conductive structure 3 (FIG. 5) with regular array of steps, which are formed by growth of a film on slightly inclined surfaces (i.e. surfaces with atomic steps), belongs to this group.

(C) A periodic structure (FIG. 6), which is self-organized during epitaxial growth or polymerization of an organic molecule or polymer. A periodic structure, which is formed inside a conductive polymer synthesized by such the manner that functional groups as a scattering center are periodically arranged, belongs to this group.

Especially, incorporation of the periodic structure (B) or (C) with steps similar to height of a monolayer in the low-dimensional conductive structure (b), (c) or (e), wherein plasmon exists with thickness similar to the monolayer, is effective for enhancing combination of the plasmon with light.

Other features of the present invention will be clearly understood from the following Example, referring to the drawings.

Ag was deposited as a monolayer on a (111) surface of Si to prepare a surface structure of Si(111)-$\sqrt{3}\times\sqrt{3}$-Ag. The surface structure was irradiated with low-speed electron beam of impact energy of −5.8–50.5 eV. An energy and a frequency of two-dimensional plasmon were measured by energy loss spectrum.

Figure 7:
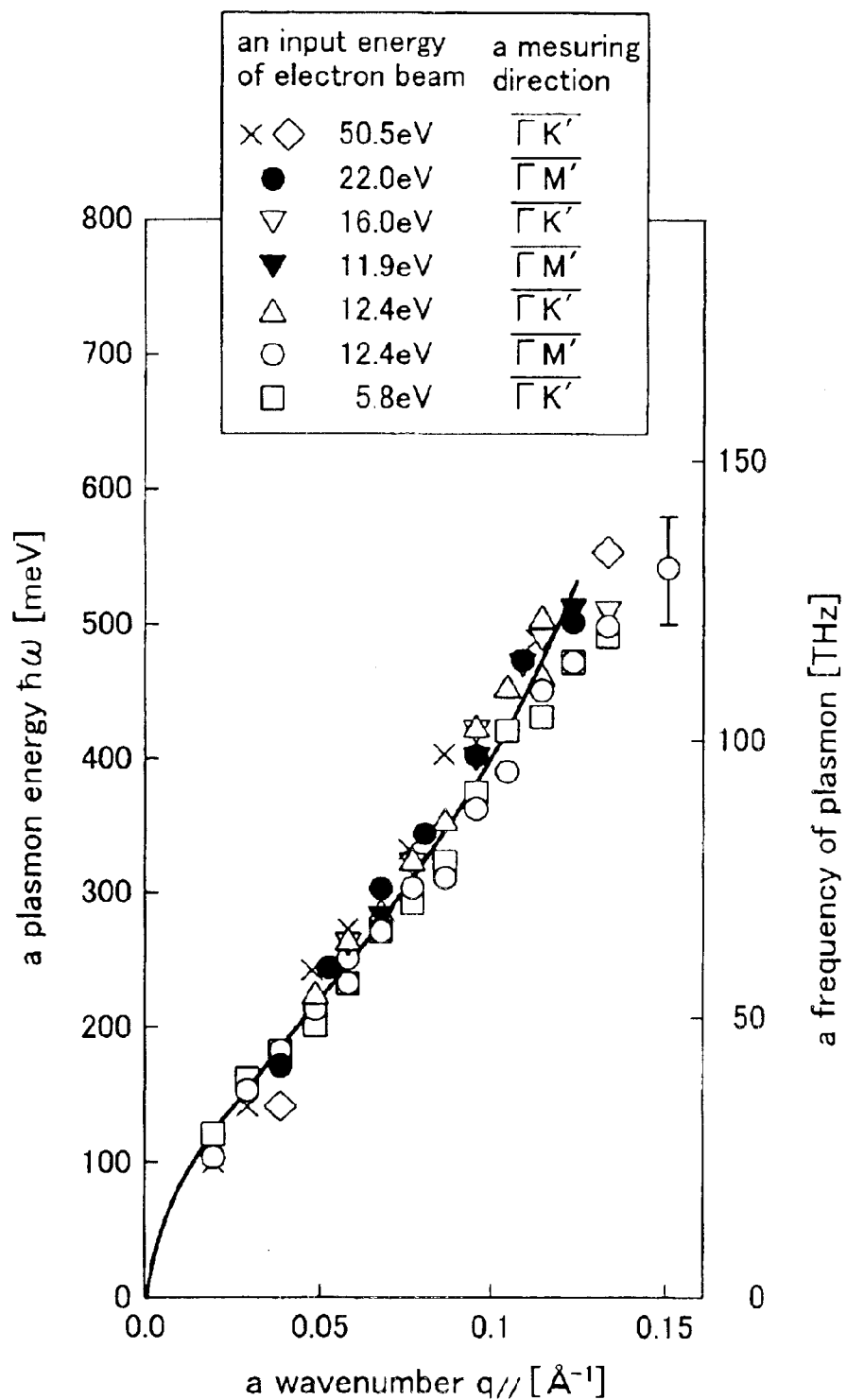
FIG. 7 is a graph showing a wavenumber-energy curve of a low-dimensional plasmon-light emitter in Example.

Measured results are shown in FIG. 7. It is noted from FIG. 7 that plasmon was produced over a broad energy range of 0–520 meV under conditions of $\in_1=1$, $\in_2=\in_{si}=11.5$, $N_{2D}=1.9\times10^{13}/cm^2$, $m^*=0.3m_e$ ($m_e$ is mass of free electron). Greater plasmon energy was generated in case of a low-dimensional substance, which had small dielectric functions $\in_1$, $\in_2$ and small effective mass $m^*$ but high two-dimensional carrier density $N_{2D}$. The results prove that a light emitter, which can produce luminescence with an energy over a broader range, can be fabricated.

A luminescent energy of $(h/2\pi)\omega_1$ or $hv_1$ can be generated by a periodic nanostructure, which has a periodicity $D_1(=2\pi/q_1)$, wherein a wavenumber $q_1$ gives a plasmon energy of $(h/2\pi)\omega_1$ or $hv_1$ in a wavenumber-energy curve. Due to the periodic microstructure, plasmon is surely coupled with an electric field accompanying the structure, so as to produce luminescence of $(h/2\pi)\omega_1$ or $hv_1$. The produced luminescence is detected by a photodetector 6.

A low-dimensional plasmon-light emitter according to the present invention has a periodic nanostructure incorporated inside or in the vicinity of a low-dimensional conductive structure, which generates low-dimensional plasmon. Since low-dimensional plasmon is strongly combined with light due to incorporation of the periodic nanostructure, an inputted electric energy can be converted to luminescence with an arbitrary energy over a broad range from a far-infrared region to an ultraviolet region. Consequently, the plasmon-light emitter is useful as sensors, display devices and light-emitting elements in various fields.

What is claimed is:

1. A low-dimensional plasmon-light emitter, which comprises:
    a low-dimensional conductive structure, which is incorporated inside or in a surface layer of a semiconductor or dielectric, for generation of low-dimensional plasmon; and
    a periodic nanostructure, which has a periodicity corresponding to a real space periodicity $D_1(=2\pi_1/q_1)$, wherein a wavenumber $q_1$ gives a luminescent energy $(h/2\pi)\omega_1$ in a wavenumber-energy curve of low-dimensional plasmon, formed near or inside said low-dimensional conductive structure.

2. The low-dimensional plasmon-light emitter defined by claim 1, wherein the low-dimensional conductive structure is selected from a quantum well formed inside a semiconductor or dielectric, a space-charge layer formed near a surface or heterojunction of a semiconductor or dielectric, a surface or interfacial electronic band with high carrier density formed on a surface or heterojunction of a semiconductor or dielectric, an epitaxial layer of a conductive organic molecule or polymer and a nanostructure inside an oxide superconductor or inorganic oxide.

3. The low-dimensional plasmon-light emitter defined by claim 1, wherein the periodic nanostructure is selected from a periodic structure formed by deposition or etching of fine metallic wires, a periodic structure of a film formed on surfaces with atomic steps and a periodic structure self-organized during epitaxial growth or polymerization of an organic molecule or polymer.

4. A low-dimensional plasmon-light emitter, which comprises:
    a one- or two-dimensional metal nanostructure, which is incorporated inside or in a surface layer of a semiconductor or dielectric, for generation of low-dimensional plasmon; and
    a periodic nanostructure, which has a periodicity corresponding to a real space periodicity $D_1(=2\pi_1/q_1)$, wherein a wavenumber $q_1$ gives a luminescent energy $(h/2\pi)\omega_1$ in a wavenumber-energy curve of low-dimensional plasmon, formed near or inside said one- or two-dimensional metal nanostructure.

5. The low-dimensional plasmon-light emitter defined by claim 4, wherein the one- or two-dimensional metal nanostructure is a high-density electron system.

* * * * *

UNITED STATES PATENT AND TRADEMARK OFFICE
CERTIFICATE OF CORRECTION

PATENT NO. : 6,946,674 B2
DATED : September 20, 2005
INVENTOR(S) : Nagao

It is certified that error appears in the above-identified patent and that said Letters Patent is hereby corrected as shown below:

Title page,
Item [56], References Cited, OTHER PUBLICATIONS,
"Sama et al." should read -- Sarma et al. --.
Item [57], ABSTRACT,
Line 2, "energy luminescence" should read -- energy to luminescence --.

Signed and Sealed this

Eighteenth Day of April, 2006

JON W. DUDAS
*Director of the United States Patent and Trademark Office*